(12) United States Patent
Shin et al.

(10) Patent No.: US 6,601,313 B2
(45) Date of Patent: Aug. 5, 2003

(54) SYSTEM AND METHOD FOR DETECTING POSITION OF SEMICONDUCTOR WAFER

(75) Inventors: Wun-Myong Shin, Kyonggi-do (KR); Sun-Kyu Kim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/995,428

(22) Filed: Nov. 27, 2001

(65) Prior Publication Data

US 2002/0104229 A1 Aug. 8, 2002

(30) Foreign Application Priority Data

Feb. 5, 2001 (KR) .......................................... 2001-5339

(51) Int. Cl.[7] .............................................. G01B 21/00
(52) U.S. Cl. ......................................... 33/645; 414/936
(58) Field of Search ......................... 33/645, 520, 613, 33/644, 533; 414/935, 936, 937, 938, 939, 940, 941

(56) References Cited

U.S. PATENT DOCUMENTS 5,980,195 A * 11/1999 Miyashita ................... 414/936
6,013,920 A * 1/2000 Gordon et al. .............. 414/937
6,162,008 A * 12/2000 Perkins et al. .............. 414/936
6,393,337 B1 * 5/2002 Perlov et al. ............... 414/936
6,457,232 B1 * 10/2002 Isogai et al. ................... 33/645

* cited by examiner

*Primary Examiner*—Christopher W. Fulton
(74) *Attorney, Agent, or Firm*—Marger Johnson & McCollom, P.C.

(57) ABSTRACT

To prevent process defects and wafer damage caused by improperly positioned wafers, a system and method for detecting a position of a wafer determines whether the wafer is properly positioned before executing a process. The system includes a chuck plate preferably having a supporting part configured to support a lower face of the wafer and a guide part located on a perimeter of the supporting part. A sensing unit senses a positional state of the wafer on an upper portion of the supporting part. A controller receives a signal corresponding to the positional state of the wafer from the sensing unit, and determines whether the wafer is properly positioned. The controller then sends an output control signal to an outputting unit to notify an operator of the wafer position. In this manner, process defects are avoided and a fabricating yield and operating rate of a fabrication unit increases.

26 Claims, 2 Drawing Sheets

SYSTEM AND METHOD FOR DETECTING POSITION OF SEMICONDUCTOR WAFER

This invention claims priority from Korean Patent Application No. 2001-5339, filed Feb. 5, 2001, the contents of which are herein incorporated by reference in their entirety.

BACKGROUND OF THE INVENTION

1. Field of the Invention

The present invention relates to a system and method for detecting a position of a semiconductor wafer and more particularly, to a system and method that determines whether the wafer is normally positioned before executing a process, to prevent process defects.

2. Discussion of Related Art

In facilities for fabricating semiconductor devices, a vacuum pressure environment is generally used to prevent pollution and maintain the purity of a wafer. Bake oven facilities, for example, typically use vacuum pressure conditions. In a bake oven, an outer housing is generally made of opaque material, such as metal, to provide durability and airtightness. Because of this, however, it is difficult to determine whether a wafer is properly positioned within the bake oven and whether the process was properly executed.

To perform a process, the wafer is first positioned on a chuck plate. A conventional procedure for placing the wafer on the chuck plate, and its attendant difficulties, will be described with reference to FIGS. 1 and 2. Referring to FIG. 1, a general robot unit (not shown) places a wafer W in position on an upper part of a chuck plate 10 inside a fabrication unit, such as a bake oven. The chuck plate 10 includes elevator pins 12 which move vertically up and down. As the wafer is placed in the fabrication unit, the elevator pins 12 are elevated to prop up and support a lower face of the wafer W. After the robot unit places the wafer W it is withdrawn. When the robot unit is retracted from the wafer W, the elevator pins 12 are lowered to bring the lower face of the wafer W to rest on the upper face of the chuck plate 10. The wafer W can be positioned and maintained on the upper face of the chuck plate 10 using special equipment, or the wafer W may be positioned and fixed using a general fixing unit (not shown) installed on the chuck plate 10. Once positioned, the wafer W receives a desired environmental condition (such as a temperature state, an electric characteristic, etc.) through a condition forming part 14 installed on the chuck plate 10.

Unfortunately, a wafer particle or other particle P may unseat a lower face of the wafer W from an upper face of the chuck plate 10. If the wafer W rests unevenly on the chuck plate 10, the environmental condition provided by the condition forming part 14 will not be properly applied to the wafer, thus resulting in a process defect.

Referring to FIG. 2, besides process defects resulting from particles unseating the wafer W from the chuck plate 10, defects may also result from poor alignment of the wafer W on the chuck plate 10. A procedure for positioning the wafer W on the chuck plate includes a series of steps. The robot unit conveys the wafer W to the chuck plate 10. The wafer W is then transferred from the robot unit to the elevated elevator pins 12. The elevator pins are then lowered to place the wafer in contact with the upper face of the chuck plate 10. During these steps, however, various kinds of shocks, vibrations, or the like may cause the wafer W to be placed off-center from a proper position on the chuck plate 10. If such an operation error occurs, a portion of the wafer may hang over an edge of the chuck plate 10. If the wafer W is improperly positioned in this manner, the process will be performed non-uniformly over the face of the wafer W. Furthermore, if the wafer W overlaps a previously positioned wafer on the chuck plate 10, not only will a pattern layer formed on the wafer W be damaged, but the next procedure will also be adversely affected.

A conventional solution to these problems is to form a transparent window in the fabrication unit to allow a user to see into a given portion of the unit. A window, however, does not readily permit a determination that the wafer W is unseated when its separation from the chuck plate 10 is minimal. Furthermore, the window only permits viewing of the wafer W from a specific, fixed position. It would be desirable in the industry to have a system and method for detecting semiconductor wafer position that would automatically correct certain defects in wafer positioning. It would also be desirable to have a system and method for detecting semiconductor wafer position that would permit detection of even minute displacements of the wafer from the chuck plate surface.

SUMMARY OF THE INVENTION

Accordingly, the present invention is directed to a system and method for detecting a position of a semiconductor wafer that substantially obviates one or more of the limitations and disadvantages of the related art.

A primary object of the present invention is to provide a system and method for detecting a position of a semiconductor wafer, in which process defects and wafer damage can be prevented to increase fabrication yield. The system and method preferably provide easy verification of wafer position to permit determination of whether the wafer has been properly transferred to a chuck plate, whether the wafer has been placed in the right position on the chuck plate, whether the wafer is folded, and whether the wafer is separated from the chuck plate.

In accordance with a preferred embodiment of the present invention, a system for detecting a position of a semiconductor wafer includes a chuck plate having a supporting part, for supporting a lower face of a wafer, and a guide part formed on an outer perimeter of the supporting part. A sensing unit senses a position of the wafer on an upper portion of the supporting part and transmits a sensing signal to a controller. The controller preferably receives the sensing signal, corresponding to the wafer position, from the sensing unit, and transmits an output control signal to an outputting unit based on the sensing signal. The outputting unit can include a bell unit for outputting alarm sound, a lamp unit for outputting light, a monitoring unit for supplying a video image, and/or a switching unit for selectively cutting off power applied for respective constructions of the fabrication facilities.

An upper side portion of an inner side wall of the guide part is preferably provided with an inwardly slanted face so as to direct a wafer positioned on the guide part toward a center of the chuck plate. The supporting part and the guide part can be formed integrally or assembled together in an operating relationship. If assembled from separate components, the guide part could be constructed to move up and down in relation to the supporting part in response to a driving control signal from the controller. It may also be desirable for the guide part to be provided in at least two segments arranged at given intervals along an outer perimeter of the supporting part. A lower part of the chuck plate can include a rotating unit configured to rotate the supporting part in response to a rotation control signal from the controller.

The sensing unit is preferably constructed having optical sensors. The optical sensors can be configured to supply irradiating probe light against an edge portion of the wafer positioned on the supporting part and to receive and sense an amount of light reflected or diffracted therefrom. In one configuration, the optical sensors can be installed between the guide part segments. Alternatively, the optical sensors can be installed in opposing pairs along the inner wall of the guide part, with each sensor in a pair being located on an opposite side of a center of the supporting part. A plurality of light emitting and receiving sensors could also be disposed in various vertical positions along the guide part inner wall.

A method of detecting a position of a semiconductor wafer is also provided. The method includes supporting an edge portion of the wafer on a guide part and placing the wafer on a supporting part. A position of the wafer on the supporting part is sensed using a sensing unit during a sensing operation. A measurement value obtained through the sensing operation is then compared with a determination value range to detect and output an adhesion state and a positional state of the wafer.

To sense the positional state of the wafer on the supporting part, the sensing unit can be constructed having light emitting and receiving sensors arranged in pairs opposite each other across the supporting part. A plurality of light emitting and receiving sensors can be disposed in various elevations along the guide part inner wall so as to sense the positional state of the wafer along an upper face of the supporting part. Alternatively, the light emitting and receiving sensors can be arranged in opposing pairs at a single elevation with the guide part configured to be raised or lowered in relation to the supporting part. In this configuration, the sensors can sense the positional state of the wafer on the upper face of the supporting part as the guide part elevates and descends.

Sensing the positional state of the wafer on the supporting part could also be accomplished by constructing the guide part with at least two segments arranged at given intervals along an outer perimeter of the supporting part. In this embodiment, the supporting part is configured to selectively rotate. The sensing unit includes an optical sensor that transmits probe light between the segments of the guide part against an edge of a wafer positioned on the rotatable supporting part. As the supporting part is rotated, the optical sensor senses an amount of light reflected or diffracted from the wafer to determine the positional state of the wafer on the upper face of the supporting part.

BRIEF DESCRIPTION OF THE ATTACHED DRAWINGS

The accompanying drawings provide a further understanding of the invention and are incorporated into and constitute a part of this specification. The various embodiments of the invention and the principles of operation thereof will be more fully explained in the following detailed description of preferred embodiments, proceeding with reference to the accompanying drawings, in which.

DETAILED DESCRIPTION OF PREFERRED EMBODIMENTS

Figure 1:
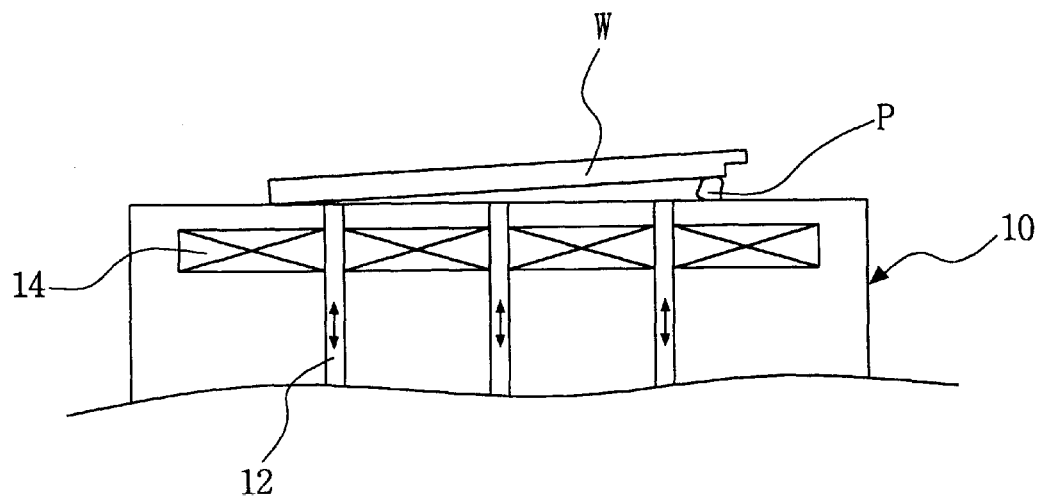
FIG. 1 is a schematic cross-sectional view of a conventional chuck plate illustrating a wafer that is unseated from the chuck plate.
Figure 2:
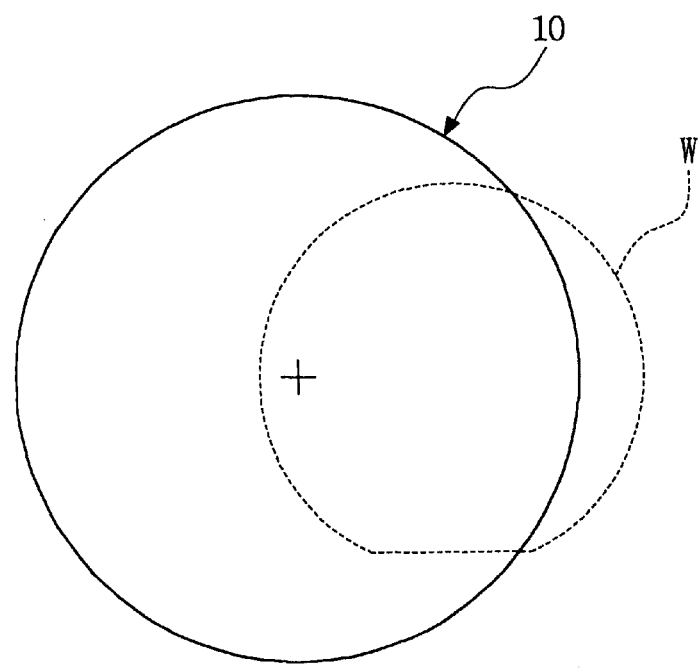
FIG. 2 is a schematic plane view of a conventional chuck plate illustrating an improperly placed wafer thereon.
Figure 3:
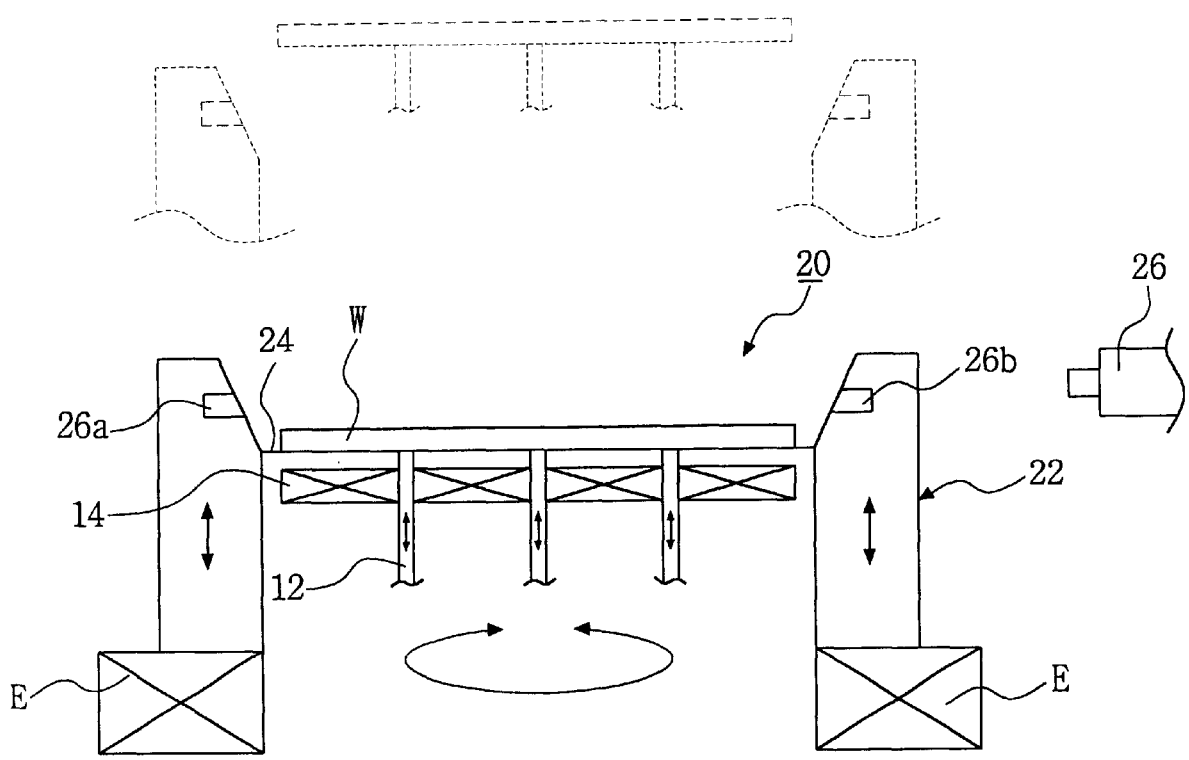
FIG. 3 is a schematic cross-sectional view of a chuck plate constructed according to a preferred embodiment of the present invention.

The preferred embodiments of the present invention will now be described in detail with reference to the accompanying drawings. FIG. 3 schematically shows the construction of a system for detecting wafer position according to a preferred embodiment of the present invention.

Referring to FIG. 3, a system for detecting the position of a semiconductor wafer, according to a preferred embodiment, includes a chuck plate 20. A central portion of the chuck plate 20 includes a supporting part 24 having an upper face that supports a lower face of the wafer W. Elevator pins 12, capable of vertical up and down movement, are included in the chuck plate 20 for positioning the wafer W on the supporting part 24. A general condition forming part 14 is provided on a lower part of the chuck plate 20 to impart an environmental condition (i.e., a temperature state, an electric characteristic, etc.) to the wafer W.

A guide part 22 is formed on an outer perimeter of the supporting part 24, and is configured to support an edge portion of the positioned wafer W. An inner side wall of the guide part 22 is formed having an inwardly sloping face. In this way, as the elevator pins 12 supporting the wafer W descend, the edge portion of the wafer W comes in contact with and is supported by the inner wall of the guide part 22. The inwardly sloping surface of the inner wall then guides the wafer W into its proper, central position on the supporting part 24. An abnormal position of the wafer W is thus corrected by the slanted inner wall of the guide part 22 to bring its position within a normal range.

Figure 4:
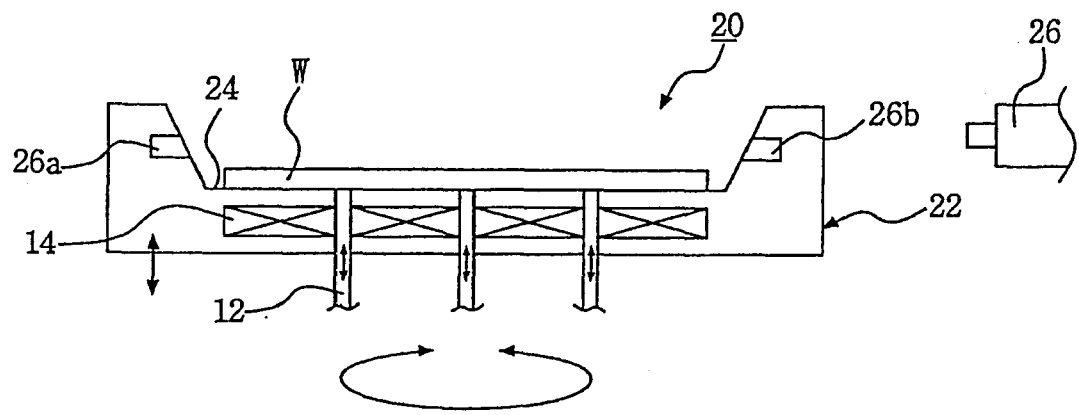
FIG. 4 is a schematic cross-sectional view of a chuck plate constructed according to an alternate embodiment of the present invention.

In accordance with one embodiment of the invention shown in FIG. 4, the guide part 22 may be formed integrally with the supporting part 24 so as to form an essentially concave-shaped upper surface of the chuck plate 20. Except for the guide part 22 being formed integrally with the supporting part 24, all other elements of FIG. 4 are the same as those shown in FIG. 3. Alternatively, the guide part 22 can be formed separately from and assembled onto an outer perimeter or the supporting part 24. Where the guide part 22 is formed separately from the supporting part 24, an elevator unit E can be provided to raise and lower the guide part 22 relative to the supporting part 24. The elevator unit E can be operated in response to a driving control signal selectively provided by a control unit.

In yet another embodiment, the guide part 22 may be formed having at least two segments arranged at intervals along an outer perimeter of the supporting part 24. The segments of the guide part 22 can be disposed apart from each other on opposite sides of the supporting part 24. Where the guide part 22 is installed in segments along the outer perimeter of the supporting part 24, the sensing unit can be an optical sensor 26 positioned on an outer side of the chuck plate 20. The optical sensor 26 transmits probe light through a gap between the segments of the guide part 22 against an edge portion of the wafer W placed on the supporting part 24. The sensor 26 senses a positional state of the wafer W by measuring an amount of light reflected or diffracted by the wafer W.

Alternatively, when the guide part 22 is divided into evenly disposed segments along the outer perimeter of the supporting part 24, light emitting and receiving sensors can be constructed and installed in opposing pairs arranged to transmit and receive light through gaps between the segments of the guide part 22. In this manner, the sensors can sense the positional state of the wafer W on the supporting part 24.

More preferably, however, the light emitting and receiving sensors can be installed in a plurality of opposing pairs 26a, 26b arranged along the inner wall of the guide part 22. The center of the supporting part 24, where the wafer W should be properly placed, is arranged between the opposing pairs. The light emitting and light-receiving sensors can further be disposed in different vertical positions along the inner wall of the guide part 22.

A rotating unit can also be installed in a lower portion of the chuck plate 20 to rotate and position the supporting part 24 in relation to the guide part 22 and the sensors 26, 26a, 26b. The rotating unit can be configured to operate in response to a selectively applied rotation control signal from the controller. By enabling rotation of the supporting part 24, any separation between the wafer W and the supporting part 24 can be accurately ascertained using sensing units 26, 26a, 26b installed at fixed positions on the guide part 22.

Once the sensing units 26, 26a, 26b determine a positional state of the wafer W, a positional state signal is sent to the controller. The controller stores thickness and process state information for the wafer W, as well as determination value information based on an appropriate position of the wafer W. The controller uses this stored information along with the positional state signal to determine whether the wafer has been properly positioned. The controller can then selectively provide an output control signal to an outputting unit to inform an operator of the determined positional state. The outputting unit can be a bell unit for outputting alarm sound, a lamp unit for outputting light, a monitoring unit for outputting an image, a switching unit for cutting off power applied for the respective construction of the fabrication facilities, and/or any other desired notification device that provides an output indicative of the positional state in response to the output control signal selectively applied from the controller.

According to another aspect of the present invention, a method for properly positioning a wafer W is provided. Still referring to FIG. 3, a wafer W is placed on an upper part of a chuck plate 20 by a general robot unit. Elevator pins 12 of the chuck plate 20 are driven upwards to prop up and support a lower face of the wafer W. The robot unit is then retracted and the elevator pins 12 are lowered to position the wafer W on an upper face position of a supporting part 24.

Unfortunately, the wafer W may be unevenly positioned over the supporting part 24 due to an error in the transfer procedure from the robot unit or in the transfer procedure to the elevator pins 12. To correct this, when the wafer W is unevenly positioned, as the elevator pins 12 descend, the wafer W comes in contact with an inwardly sloping face of an inner wall of a guide part 22. The sloping surface of the inner wall of the guide part 22 directs the wafer W toward a central portion of the supporting part 24.

This positional compensation provided by the guide part 22 can alternatively be obtained by applying an elevating and descending control signal to an elevator unit E. The elevating control signal causes the elevator unit E to drive the guide part 22 upward, causing it to contact and support an edge of the wafer W. As the guide part 22 ascends, its inwardly sloping inner wall urges the wafer W toward a central position on the chuck plate 20. The descending control signal is then applied to cause the guide part 22 to descend to a given position. The elevator pins 12 are also lowered. According to this procedure, an upper portion of the inner wall of the guide part 22 supports the wafer W as it begins to separate from the elevator pins 12. This prevents damage or breakage of the wafer W that may be caused by an escape of the wafer W from the chuck plate 20.

Despite the improvement offered by the guide part 22, positional errors can still occur. For example, a positional error can occur if the wafer W is so poorly transferred that it is not supported by the inner wall of the guide part 22. Also, if the wafer W spans upper ends of the guide part 22 or if particles of the wafer W or various other kinds of particles exist on the upper face of the supporting part 24, positional errors can occur such that the wafer W does not rest evenly on the upper face of the supporting part 24.

When positional errors do occur, the sensing unit senses the positional state of the wafer W placed on the supporting part 24. The sensing unit can, for instance, include the optical sensor 26 described above, where the guide part 22 is divided into at least two segments. In this case, the optical sensor 26, located on the outer side of the chuck plate 20, transmits probe light to an edge portion of the wafer W to determine whether it is properly positioned on the supporting part 24. The probe light is transmitted through an opening between the guide parts 22. The supporting part 24 is rotated by driving the rotating unit in the lower part of the chuck plate 20. As the supporting part is rotated, the optical sensor measures the positional state of the wafer W by measuring an amount of light reflected or diffracted therefrom. The sensor sends positional state signals to a control unit that determines whether the wafer W is off-center or separated from the upper face of the supporting part 24.

Where the sensing unit includes light emitting and receiving sensors and the guide part 22 is divided into segments, the sensors could alternatively be arranged in opposing pairs with a central portion of the supporting part 24 disposed between them. In this embodiment, the sensors are located in gaps between the segments of the guide part 22. The sensors again transmit and receive light to sense the positional state of the wafer W on the supporting part 24. Where the light emitting and receiving sensors 26a, 26b are installed in opposing pairs along the inner wall of the guide part 22, the sensors sense the positional state of the wafer W at their given, respective positions. If the guide part 22 is integral with the supporting part 24, rotation through the supporting part 24 and the rotating unit is not provided. Where the guide part 22 is formed separately from the supporting part 24, however, rotation of the supporting part 24 may be provided, if desired. In addition, where separately formed, the guide part 22 may be provided with an elevator unit E to permit vertical movement of the sensors 26a, 26b in relation to the supporting part 24, and a wafer W positioned thereon. In addition to the positional compensation benefits identified previously, vertical movement of the guide part 22 permits the sensors 26a, 26b to sense the position of the wafer at various elevations. Sensing wafer position at various vertical positions allows the sensors 26a, 26b to more accurately determine the positional state of the wafer W in relation to the upper face of the supporting part 24.

Once the sensing unit senses the positional state of the wafer W, the sensed positional state measurement value is transmitted to the controller. The controller then compares predetermined wafer information such as thickness, process state information, and a determination value corresponding to a properly positioned wafer with the sensed measurement value to determine whether the wafer W is properly positioned. The controller then selectively applies an output control signal to the outputting unit so that the worker can easily confirm the decided positional state. The outputting unit can be configured to selectively supply a sound, a light, a video image to a monitoring unit, or any other desired notification of the positional state to a user. The outputting unit could also be configured to selectively cut off driving power to the fabrication unit to prevent damage and breakage of the wafer W. In this manner, process defects caused by positional errors of the wafer W can be avoided.

As described above, in accordance with various preferred embodiments of the present invention, a wafer can be guided into a proper position on a chuck plate of a fabrication unit using a properly configured guide part. In addition, a positional state of the wafer can be readily determined using an appropriately configured sensing unit. In other words, whether or not the wafer has been properly transferred to the chuck plate, whether or not the wafer is properly seated on the chuck plate, and whether or not the wafer has been folded can be accurately determined using the driving and sensing equipment described previously. Process defects and damaged or broken wafers can thereby be prevented to improve a fabrication yield.

It will be apparent to those skilled in the art that variations and modifications can be made to the above-described preferred embodiments without deviating from the spirit or scope of the present invention. This invention should therefore be interpreted to cover all variations and modifications coming within the spirit and scope of the appended claims and their equivalents.

What is claimed is:

1. A system that positions a semiconductor wafer, said system comprising:
    a chuck plate having a supporting part that supports a lower face of a semiconductor wafer positioned on the chuck plate;
    a guide part that corrects a position of the semiconductor wafer on the chuck plate;
    a sensing unit that senses the position of the semiconductor wafer on the chuck plate, wherein the sensing unit comprises a pair of optical sensors arranged on the guide part on opposite sides of the supporting part.

2. A system according to claim 1, further comprising a controller configured to receive a positional state signal from the sensing unit and to compare the positional state signal with predetermined information to determine whether the wafer is properly positioned.

3. A system according to claim 2, further comprising an outputting unit configured to receive an output control signal from the controller and to notify a user of a positional state of the wafer.

4. A system according to claim 1, wherein the guide part is disposed on an outer perimeter of the supporting part.

5. A system according to claim 4, wherein the guide part comprises an inwardly sloping inner wall.

6. A system according to claim 4, wherein the guide part comprises a plurality of segments disposed at given intervals along the outer perimeter of the supporting part.

7. A system according to claim 6, wherein the sensing unit comprises an optical sensor arranged to supply light to an edge of the wafer and to receive light reflected or diffracted from the wafer through a gap between the guide part segments.

8. A system according to claim 6, wherein the sensing unit comprises a sensor pair arranged opposite each other across the supporting part, wherein the sensor pair is configured to supply and receive light through gaps between the guide part segments.

9. A system according to claim 1, wherein the sensing unit comprises a plurality of optical sensors and optical transmitters arranged along an inner wall of the guide part.

10. A system according to claim 9, wherein each of the optical sensors is located directly across the supporting part from a corresponding optical transmitter, forming an opposing pair.

11. A system according to claim 10, wherein a plurality of opposing pairs arranged at different vertical positions along the inner wall.

12. A system according to claim 1, further comprising an elevator unit configured to selectively raise and lower the guide part in relation to the supporting part.

13. A system according to claim 1, further comprising a rotating unit configured to rotate the supporting part in relation to the guide part.

14. A system according to claim 1, wherein the guide part is formed integrally with the supporting part.

15. A system according to claim 1, wherein the sensing unit comprises a plurality of optical sensors arranged in part along an inner wall of the guide part and wherein sensors in each sensor pair are arranged opposite each other across the supporting part.

16. A system according to claim 1, wherein the sensing unit senses an elevation in relation to an upper surface of the supporting part to determine whether the wafer is seated properly on the supporting part.

17. A system according to claim 1, wherein the sensing unit senses a horizontal position relative to a center of the chuck plate to determine whether the wafer is centrally positioned on the chuck plate.

18. A method for properly positioning a semiconductor wafer on a chuck plate in a fabrication unit, said method comprising:
    supporting a wafer on elevator pins of the chuck plate;
    lowering the elevator pins;
    contacting the wafer with a, guide part to direct the wafer to a central position on the chuck plate; and
    sensin a positional state of the wafer on the chuck plate, wherein sensing a positional state of the wafer on the chuck plate comprises sensing an elevation of the wafer in relation to an upper surface of the chuck plate.

19. A method according to claim 18, wherein sensing a positional state of the wafer on the chuck plate further comprises sensing a horizontal position of the wafer in relation to a center of the chuck plate.

20. A system that positions a semiconductor wafer, said system comprising:
    a chuck plate having a supporting part that supports a lower face of a semiconductor wafer positioned on the chuck plate;
    a guide part that corrects a position of the semiconductor wafer on the chuck plate;
    a sensing unit that senses the position of the semiconductor wafer on the chuck plate, wherein the sensing unit comprises a plurality of optical sensors and optical transmitters arranged along an inner wall of the guide part.

21. A system according to claim 20, wherein each of the optical sensors is located directly across the supporting part from a corresponding optical transmitter, forming an opposing pair.

22. A system according to claim 21, wherein a plurality of opposing pairs are arranged at different vertical positions along the inner wall.

23. A system for positioning a semiconductor wafer, said system comprising:

a chuck plate having a supporting part that supports a lower face of a semiconductor wafer positioned on the chuck plate;

a guide part that corrects a position of the semiconductor wafer on the chuck plate, wherein the guide part is formed integrally with the supporting part; and a sensing unit that senses a position of the semiconductor wafer on the chuck plate.

24. A system according to claim 23, further comprising a controller configured to receive a positional state signal from the sensing unit and to compare the positional state signal with predetermined information to determine whether the wafer is properly positioned.

25. A system according to claim 24, further comprising an outputting unit configured to receive an output control signal from the controller and to notify a user of a positional state of the wafer.

26. A system according to claim 23, wherein the sensing unit comprises a pair of optical sensors arranged on the guide part on opposite sides of the supporting part.

* * * * *

UNITED STATES PATENT AND TRADEMARK OFFICE
CERTIFICATE OF CORRECTION

PATENT NO. : 6,601,313 B2
DATED : August 5, 2003
INVENTOR(S) : Wun-Myong Shin and Sun-Kyu Kim It is certified that error appears in the above-identified patent and that said Letters Patent is hereby corrected as shown below:

Drawings,
Insert FIG. 4., as shown on the attached page herewith.

Column 8,
Line 39, "wafer sensin a positional state" has been changed to -- wafer sensing a positional state --

Signed and Sealed this

Twenty-seventh Day of January, 2004

JON W. DUDAS
*Acting Director of the United States Patent and Trademark Office*